(12) United States Patent  
Chen et al.

(10) Patent No.: US 9,267,664 B2
(45) Date of Patent: Feb. 23, 2016

(54) PATTERNED COLOR CONVERSION FILM AND DISPLAY DEVICE USING THE SAME

(71) Applicant: InnoLux Corporation, Miao-Li County (TW)

(72) Inventors: Chih-Jung Chen, Miao-Li County (TW); Ruey-Jer Weng, Miao-Li County (TW); Jiun-Yi Lien, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 247 days.

(21) Appl. No.: 14/100,381

(22) Filed: Dec. 9, 2013

(65) Prior Publication Data

US 2014/0192294 A1 Jul. 10, 2014

(30) Foreign Application Priority Data

Jan. 7, 2013 (TW) .............................. 102100418 A

(51) Int. Cl.
*G02F 1/1335* (2006.01)
*F21V 9/08* (2006.01)
*F21V 9/16* (2006.01)
*H01L 27/32* (2006.01)

(52) U.S. Cl.
CPC ............ *F21V 9/08* (2013.01); *G02F 1/133514* (2013.01); *G02F 1/133621* (2013.01); *F21V 9/16* (2013.01); *G02F 1/133617* (2013.01); *G02F 2001/133614* (2013.01); *G02F 2202/108* (2013.01); *H01L 27/3211* (2013.01)

(58) Field of Classification Search
CPC ................... G02F 1/133514; G02F 1/133621; F21V 9/08
See application file for complete search history.

(56) References Cited

U.S. PATENT DOCUMENTS

| 2007/0200492 | A1 | 8/2007 | Cok et al. | |
| 2011/0261303 | A1* | 10/2011 | Jang | ..................... G02F 1/13318 349/108 |
| 2012/0113672 | A1* | 5/2012 | Dubrow | ................. B82Y 20/00 362/602 |

FOREIGN PATENT DOCUMENTS

| CN | 201107513 Y | 8/2008 |
| TW | 201115531 A | 5/2011 |
| TW | 201204813 A | 2/2012 |
| TW | 201234646 A | 8/2012 |
| TW | I423444 B | 1/2014 |

* cited by examiner

*Primary Examiner* — Dung Nguyen
(74) *Attorney, Agent, or Firm* — Bacon & Thomas, PLLC

(57) ABSTRACT

A patterned color conversion film and a display device using the same are disclosed. The patterned color conversion film of the present invention comprises: a separator with plural openings; and plural pixel units disposed in the openings respectively, each pixel unit respectively comprising: a medium and scattering particles dispersed therein. Herein, at least one of the plural pixel units comprises quantum dots having the scattering particles sized of between 0.05 and 1 μm when a volume concentration of the quantum dots is in a range more than or equal to 5% and less than or equal to 80%, or having the scattering particles sized of between 0.2 and 2 μm when the volume concentration of the quantum dots is in a range less than 5% and more than or equal to 0%.

20 Claims, 7 Drawing Sheets

PATTERNED COLOR CONVERSION FILM AND DISPLAY DEVICE USING THE SAME

CROSS REFERENCE TO RELATED APPLICATION

This application claims the benefits of the Taiwan Patent Application Serial Number 102100418, filed on Jan. 7, 2013, the subject matter of which is incorporated herein by reference.

BACKGROUND OF THE INVENTION

1. Field of the Invention

The present invention relates to a patterned color conversion film (PCCF) and a display device using the same and, more particularly, to a patterned color conversion film prepared with quantum dots to replace conventional color filters and a display device using the same.

2. Description of Related Art

Quantum dots (QDs) are a kind of zero dimensional semiconducting nanocrystals, and the sizes thereof in each direction are all in nano-scales. As the sizes of the semiconductor particle decreased to nano-scales, the surface effect thereof induces QDs to have different physical and chemical properties from those of mass material. In addition, when the size of the particles is less than exciton Bohr radius, the bandgap thereof may be increased and the wavelength of the emitting light thereof may be shorten as the size thereof decreased. Hence, the wavelength of the emitting light of the quantum dots can be adjusted through changing the particle size thereof. In addition, the spectrum of the quantum dots can be reduced into fill width at half maximum (FWHM), which cannot be accomplished by conventional fluorescent materials or light-emitting materials. Recently, quantum dot/polymer complex has been widely applied to the backlight and lighting fields. For example, Nexxus Lighting has provided a quantum dot LED lighting, NNCrystal has developed a quantum dot platform Qshift, Nanosys has provided a quantum dot enhanced film (QDEF), and Nanoco has developed quantum dots without using Cd. Furthermore, complexes containing quantum dots with different light-emitting wavelength can convert single wavelength light emitting from a backlight source into light with various wavelengths. Hence, patterned color conversion films made of quantum dot complexes have potential to replace conventional color filters.

However, in the case that the color filters are substituted with patterned color conversion films made of quantum dot complexes, the backlight cannot be absorbed completely and color shifts and poor viewing angle characteristics may be occurred as the thickness of the patterned color conversion films is not thick enough. In order to absorb and convert the backlight completely, the thickness of the patterned color conversion films has to be increased. However, the films with increased thickness may cause material waste and increase the process complexity. Meanwhile, most of the light emitting from the quantum dots enters into a waveguide mode. Hence, when the patterned color conversion films was used as color filters, the light in the waveguide mode may be absorbed by black matrix thereof, which cause the light extraction rate of the film decreased.

Therefore, it is desirable to provide a patterned color conversion film, which has high backlight utilization rate and high light extraction rate without increasing the thickness thereof, and the problem of color shift thereof can also be solved, in order to replace the conventional color filters used in display devices.

SUMMARY OF THE INVENTION

An object of the present invention is to provide a patterned color conversion film containing scattering particles, which can increase the utilization rate of backlight (i.e. the absorption rate of the backlight) and the light extraction rate, and improve the problem of poor viewing angle characteristics.

Another object of the present invention is to provide a display device, which uses a patterned color conversion film with quantum dots and scattering particles to replace a conventional color filter.

To achieve the object, the patterned color conversion film of the present comprises: a separator with plural openings; and plural pixel units disposed in the openings respectively, each pixel unit respectively comprising: a medium and scattering particles dispersed therein. Herein, at least one of the plural pixel units comprises quantum dots having the scattering particles sized of between 0.05 and 1 μm when a volume concentration of the quantum dots in the pixel unit is in a range more than or equal to 5% and less than or equal to 80% (5%<X<80%), or having the scattering particles sized of between 0.2 and 2 μm when the volume concentration of the quantum dots in the pixel unit is in a range less than 5% and more than or equal to 0% (0%<X<5%).

The absorption efficiency of backlight of a film is proportional to the paths that the backlight travelling therein. In the case that a conventional color filter is replaced with a patterned color conversion film containing quantum dots doped complex material without using scattering particles, the thickness of the patterned color conversion film has to be increased in order to make the film absorb and converse the backlight completely and utilize the same fully. However, the amounts of the medium and the quantum dots have to be increased for preparing the patterned color conversion film with the increased thickness, and also the process for manufacturing the same is getting more complicated. Meanwhile, most of the light emitting from the quantum dots doped in the patterned color conversion film without using the scattering particles may enter into a waveguide mode, and the light in the waveguide mode is finally absorbed by a separator (for example, a black matrix), which causes the light extraction rate of the film decreased.

It is known that the color conversion film is a self-luminous film, and the light-transmitting rate corresponding to partial polarized light of the film is more intense at large viewing angles than that at smaller viewing angles. The angle with the maximum light-transmitting rate is generally called Brewster's angle. For the film having thickness in micro-scale or thicker, the light intensity observed at large viewing angles is higher than that observed at smaller viewing angle. The aforementioned factors cause the light intensity observed at large viewing angles of the film having the strongest intensity, which fails to meet the requirement for display devices. For example, in the case using blue light as backlight, the light pattern thereof generally has high directivity, and the light intensity thereof is the strongest at the front viewing angle. When the blue backlight is used with a transparent pixel as a blue pixel and red and green pixels doped with quantum dots, the mismatch of the viewing angles between the blue pixel and other pixels including the red and green pixels may cause the problem of color shift.

On the other hand, in the patterned color conversion film of the present invention, the suitable scattering particles contained therein can make the backlight irradiating into the film diffuse along with the directions of the incident light to generate a light scattering phenomenon. Even though the thickness of the film of the present invention is not increased, the quantum dots contained therein still can completely absorb the backlight due to the light scattering phenomenon, and therefore the utilization rate of the backlight can further be improved. Meanwhile, the scattering particles can influence and lead the light pattern, so both the problems of the strongest intensity observed at large viewing angles of the film and the color shift causing by the mismatch of the viewing angles between the transparent pixel and other colored pixel can be solved. In addition, the light scattering phenomenon caused by the scattering particles can extract the light, which is emitted from the quantum dots and enters into the waveguide mode, from the color conversion film; so the light extraction rate of the film from the self-luminous quantum dots can further be improved. Therefore, when the conventional color filter used in the display device is replaced with the patterned color conversion film of the present invention, the purposes of high light extraction rate, high backlight utilization rate and uniform viewing angles of the film can be achieved without increasing the thickness thereof.

In the patterned color conversion film of the present invention, a volume concentration (i.e. volume percentage) of the scattering particles is 0.5-20% respectively, in order to obtain the best light scattering phenomenon.

In the patterned color conversion film of the present invention, a refractive index of the medium is in a range from 1.4 to 1.7 respectively. Herein, examples of the medium generally used may comprise: silicone, epoxy, poly(methyl acrylate), poly(methyl methacrylate), a copolymer of methyl acrylate and methacrylic acid, a copolymer of methyl acrylate and cyclohexyl methacrylate, or a copolymer of methyl acrylate and diallyldimethylammonium chloride, but the present invention is not limited thereto.

In the patterned color conversion film of the present invention, the scattering particles in each pixel unit have to be micro-sized particles made of transparent materials with low absorption rate, and the refractive index thereof has to be different from that of the medium. For example, a refractive index of the scattering particles may be in a range from 1.0 to 3.0. In addition, each scattering particle may be made of an inorganic material, a transparent polymer, glass, hole, or a combination thereof. Specific examples of the material of each scattering particles comprises: ZnO, $TiO_2$, polystyrene, polycarbonate, styrene-acrylonitrile, $SiO_2$, borosilicate, air, or a combination thereof, but the present invention is not limited thereto.

In addition, the patterned color conversion film of the present invention may have a thickness of 10-300 μm.

Furthermore, in the patterned color conversion film of the present invention, the separator is made of a resin, a black matrix, a white matrix, a metal, a dried film, or a combination thereof. A specific example of the separator commonly used is the black matrix.

As the types of the used backlight and the light source different, the color of each pixel unit in the patterned color conversion film may also be different in the present invention.

In one aspect of the present invention that the backlight or the light source emits UV light, at least one of the plural pixel units of the patterned color conversion film of the present invention may comprise a red pixel unit, a green pixel unit, and a blue pixel unit. In this aspect, the red pixel unit, the green pixel unit, and the blue pixel unit respectively comprises: the medium, the scattering particles dispersed therein, and the quantum dots dispersed therein.

In another aspect of the present invention that the backlight or the light source emits light having the same color as that of desirable light passing through one of the pixel units, this pixel unit can be a transparent pixel unit without adding any quantum dot therein. It should be noted that the wavelength of the emitting light of the backlight or the light source has to be shorter than that of light passing through the other pixel units. For example, at least one of the plural pixel units comprises a red pixel unit, a green pixel unit, and a transparent pixel unit when the backlight or the light source emits blue light. In this aspect, the red pixel unit and the green pixel unit respectively comprises: the medium, the scattering particles dispersed therein, and the quantum dots dispersed therein, and the transparent pixel unit comprises: the medium, and the scattering particles dispersed therein.

In addition, the present invention further provides a display device, which comprises: a light source; and the aforementioned patterned color conversion film disposed on an emitting surface of the light source. Herein, the display device provided in the present invention can be a liquid crystal display device or an organic light emitting diode (OLED) display device.

In the case that the display device of the present invention is a liquid crystal display device, the display device of the present invention may further comprise: a first polarizer disposed on the light source; a first substrate disposed on the first polarizer, wherein a first electrode is disposed on the first substrate; a second substrate with a second electrode disposed on a first side thereof; a liquid crystal layer disposed between the first substrate and the second substrate; and a second polarizer disposed on a second side of the second substrate, or between the second substrate and the second electrode. Herein, the patterned color conversion film is disposed outside the first polarizer or the second polarizer. More specifically, the patterned color conversion film is disposed on a first side of the first polarizer opposite to a second side thereof facing to the second polarizer, or a first side of the second polarizer opposite to a second side thereof facing to the first polarizer.

When the second polarizer is disposed on the second side of the second substrate, the patterned color conversion film is disposed on the second polarizer or between the light source and the first polarizer. Alternatively, when the second polarizer is disposed between the second substrate and the second electrode, the patterned color conversion film is disposed between the second substrate and the second polarizer.

Herein, in the case that the display device of the present invention is a liquid crystal display device, the light source can be a blue light source or an UV light source. The structures of the pixel units are illustrated above, so the descriptions related thereto are omitted here.

In the case that the display device of the present invention is an OLED display device, the display device of the present invention may further comprises: a first electrode disposed under the light source; and a second electrode disposed on the light source, wherein the light source is an organic layer and disposed between the first electrode and the second electrode, and the patterned color conversion film is disposed on the second electrode. More specifically, the organic layer as the light source, the second electrode layer and the patterned color conversion film are sequentially laminated on the first electrode.

Herein, in the case that the display device of the present invention is an OLED display device, the organic layer as the light source is a blue light source. The structures of the pixel units are illustrated above, so the descriptions related thereto are omitted.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
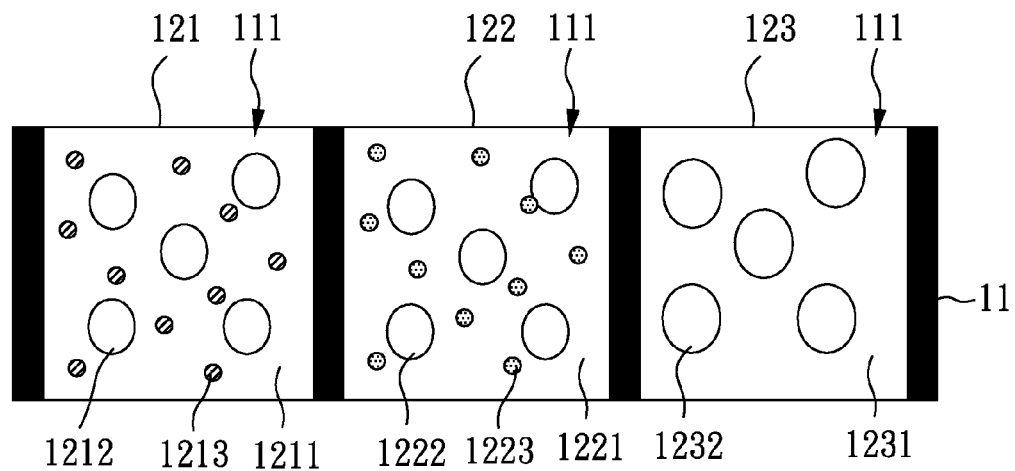
FIG. 1 is a cross-sectional view of a patterned color conversion film according to Embodiment 1 of the present invention.

As shown in FIG. 1, the present embodiment provides a patterned color conversion film which can be used with a backlight or a light source (not shown in the figure) emitting blue light, comprising: a separator 11 with plural openings 111; and a red pixel unit 121, a green pixel unit 122, and a transparent pixel unit 123 respectively disposed in the openings 111. The red pixel unit 121 and the green pixel unit 122 respectively comprise: a medium 1211, 1221, scattering particles 1212, 1222 dispersed therein, and quantum dots 1213, 1223 dispersed therein. The transparent pixel unit 123 comprises: a medium 1231, and scattering particles 1232 dispersed therein.

In the patterned color conversion film of the present embodiment, the material of the medium 1211, 1221, 1231 can be any known material used in the art, and preferably is a material having a refractive index in a range from 1.4 to 1.7, respectively. Specific examples of the medium generally used may comprise: silicone, epoxy, poly(methyl acrylate), poly (methyl methacrylate), a copolymer of methyl acrylate and methacrylic acid, a copolymer of methyl acrylate and cyclohexyl methacrylate, or a copolymer of methyl acrylate and diallyldimethylammonium chloride, but the present invention is not limited thereto.

In addition, in the patterned color conversion film of the present embodiment, the scattering particles 1212, 1222, 1232 can be any transparent particles, as long as the refractive index thereof is different from that of the medium 1211, 1221, 1231 and the scattering particles 1212, 1222, 1232 does not absorb the light emitting from the quantum dots or the light source. Preferably, the refractive index thereof is in a range from 1.0 to 3.0. More preferably, the refractive index thereof is in a range from 1.7 to 2.5. If the refractive index thereof is more than 3, the significant light reflectance may cause the light-transmitting rate of the film reduced. Herein, specific examples of the material of the scattering particles used herein comprise: ZnO, $TiO_2$, polystyrene, polycarbonate, styrene-acrylonitrile, $SiO_2$, borosilicate, air, or a combination thereof, but the present invention is not limited thereto. Preferably, the scattering particles are made of an inorganic material, in order to stabilize the property and the function of the patterned color conversion film of the present invention.

Except for the refractive index of the scattering particles, the sizes thereof also have to be placed into consideration. The intensity of the scattering light is proportional to the $6^{th}$ power of the diameters of the scattering particles, and is inversely proportional to the $4^{th}$ power of the wavelength of the incident light. If the diameter thereof is too small, the scattering effect thereof is not sufficient. If the diameter thereof is too large and larger than the wavelength of the incident light, the divergent angle thereof is not big enough. Hence, the scattering particles with suitable sizes can form scattering light with a proper divergent angle along the direction of the incident light. Preferably, the sizes (or the diameters) of the scattering particles are close to the wavelength of the incident light.

In addition, the sizes of the scattering particles are adjusted according to the volume concentration of the quantum dots in the pixel units. Hence, scattering particles with large divergent angles (i.e. small sizes) are contained in the pixel unit when a volume concentration of the quantum dots in the pixel unit is in a range more than or equal to 5% and less than or equal to 80% for the purpose of absorbing the backlight completely and extracting the fluorescence emitting from the quantum dots. Preferably, the scattering particles are sized of 0.05 to 1 μm. The volume concentration of the quantum dots in the pixel unit is varied based on the thickness of the film. In order to obtain better effect, the volume concentration thereof is smaller as the thickness of the film increased, and the volume concentration thereof is higher as the thickness of the film decreased.

On the other hand, scattering particles with small divergent angles (i.e. large sizes, in which the divergent angles thereof is almost equal to the angle of the total reflectance of the medium) are contained in the pixel unit when the volume concentration of the quantum dots in the pixel unit is in a range less than 5% and more than or equal to 0%, in order to obtain high light-transmitting rate of the backlight and extensive light pattern to make the viewing angle of this pixel unit matched with that of other pixel unit containing quantum dots. Preferably, the scattering particles 1232 as shown in FIG. 1 are sized of 0.2 to 2 μm. Herein, in the pixel unit without containing quantum dots, the volume concentration of the quantum dots therein is considered as 0%.

Except for the sizes of the scattering particles, the volume concentration of the scattering particles in each pixel unit is also one factor influencing the scattering effect thereof. The scattering effect is not obvious as the volume concentration of the scattering particles is too low (lower than 0.5%). However, when the volume concentration thereof is too high (higher than 20%), the distance between the scattering particles is much smaller than the wavelength of the incident light, so the scattering light caused by different scattering particles may interfere with each other, which leads to the obtained scattering effect decreased. Herein, regardless of the red pixel unit 121, the green pixel unit 122, or the transparent pixel unit 123 shown in FIG. 1, the volume concentration of the scattering particles, 1212, 1222, 1232 in each pixel unit including the red pixel unit 121, the green pixel unit 122, and the transparent pixel unit 123 is in a range between 0.5 and 20% respectively.

In addition, suitable surfactants or binders may also be added into the medium of the pixel units, in order to disperse the scattering particles more uniformly and increase the light extraction rate of the film.

Herein, only the refractive index, the size, the volume concentration and the material of the scattering particles 1212, 1222, 1232 3, as well as the material and the refractive index of the medium 1211, 1221, 1231 in the red pixel unit 121, the green pixel unit 122, or the transparent pixel unit 123 are illustrated. However, it should be noted that the refractive index, the size, the volume concentration and the material of the scattering particles, as well as the material and the refractive index of the medium may be identical or different in distinct pixel units.

In addition, the separator 11 used in the present embodiment can be made of a resin, a black matrix, a white matrix, a metal, a dried film, or a combination thereof. In the present embodiment, the separator 11 is a black matrix, but the present invention is not limited thereto.

Furthermore, the orientation and the size of the pixel units, the concentration of the quantum dots and the thickness of the patterned color conversion film of the present embodiment may be varied according to the user requirements such as the requirement for the display device. In the present embodiment, the thickness of the patterned color conversion film preferably is 10-300 μm. More preferably, the thickness thereof is 10-100 μm. Most preferably, the thickness thereof is 10-50 μm.

Figure 2:
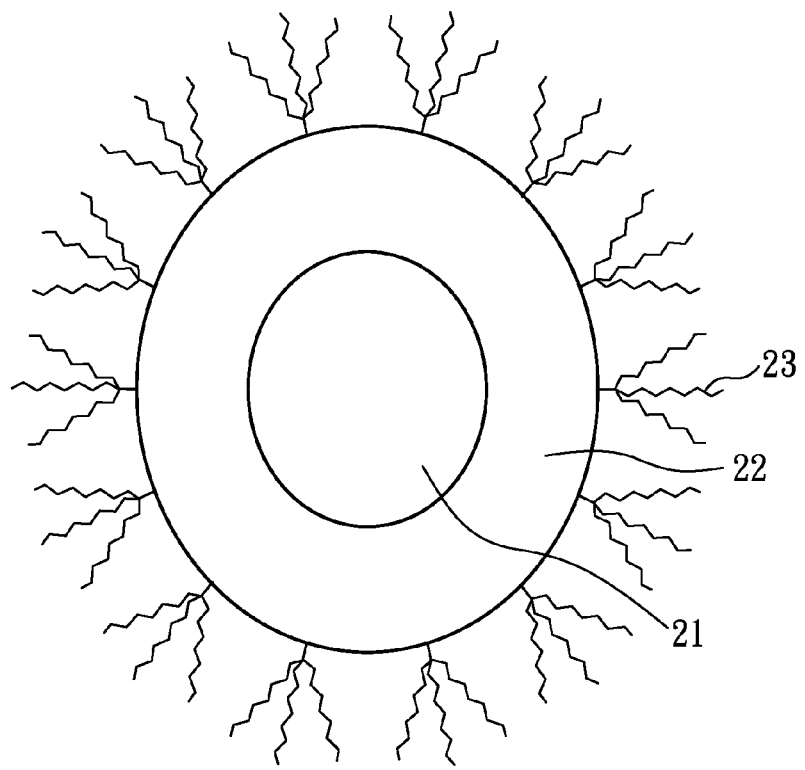
FIG. 2 is a perspective view showing a structure of a quantum dot used in Embodiment 1 of the present invention.

In the present embodiment, the used quantum dots 1213, 1223 can be any quantum dots generally used in the art. The basic structure thereof is shown in FIG. 2, which comprises: a core 21 with a diameter of between 1 and 15 nm; a shell 22 comprising a single layer or multiple layers; and a surfactant 23 formed on the shell 22. Herein, the materials of the core 21 and the shell 22 are not particularly limited. For example, the materials thereof can be binary semiconductor materials selected from the group consisting of ZnS, ZnSe, ZnTe, CdS, CdSe, CdTe, MnSe, HgS, HgSe, HgTe, AN, AlP, AlAs, AlSb, GaN, GaP, GaAs, GaSb, GaSe, InN, InP, InAs, InSb, TlN, TlP, TlAs, TlSb, PbS, PbSe and PbTe; ternary or more semiconductor materials selected from the group consisting of $Cd_xZn_{1-x}Se$, $CdxZn_{1-x}S$, $CuInS_2$, $CuInSe_2$, $AgInS_2$, $AgInSe_2$, $In_xGa_{1-x}P$, and $Cd_xZn_{1-x}S_ySe_{1-y}$; or doped semiconductor materials selected from the group consisting of MnSe:Cu, MnSe:Mn, CdS:Cu, CdS:Mn, $In_2S_3$:Cu, ZnO:Cu and ZnO:Mn.

Embodiment 2

Figure 3:
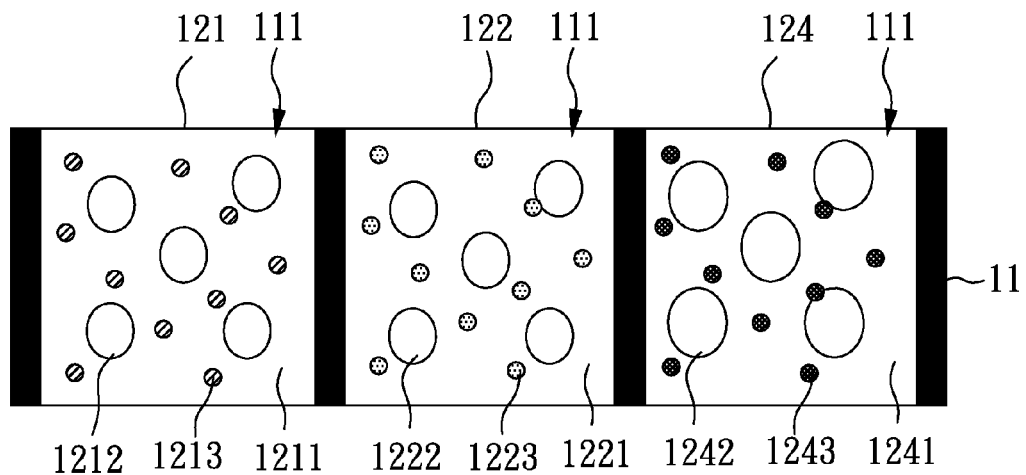
FIG. 3 is a cross-sectional view of a patterned color conversion film according to Embodiment 2 of the present invention.

As shown in FIG. 3, the present embodiment provides a patterned color conversion film which can be used with a backlight or a light source (not shown in the figure) emitting UV light, comprising: a separator 11 with plural openings 111; and a red pixel unit 121, a green pixel unit 122, and a blue pixel unit 124 disposed in the openings 111 respectively. Herein, the red pixel unit 121, the green pixel unit 122, and the blue pixel unit 124 respectively comprises: a medium 1211, 1221, 1241, scattering particles 1212, 1222, 1242 dispersed therein, and quantum dots 1213, 1223, 1243 dispersed therein.

Briefly, as shown in FIG. 1 and FIG. 3, the difference between the present embodiment and Embodiment 1 is that the transparent pixel unit 123 of Embodiment 1 is substituted with the blue pixel unit 124 in the present embodiment.

In the present embodiment, the materials and the refractive index of the medium 1211, 1221, 1241 are similar to those illustrated in Embodiment 1, so the description related thereto is omitted here.

In addition, in the present embodiment, the refractive index, the sizes, the volume concentration and the materials of the scattering particles 1212, 1222, 1242 in the red pixel unit 121, the green pixel unit 122, and the blue pixel unit 124 are similar to those in the red pixel unit and green pixel unit illustrated in Embodiment 1, so the description related thereto is omitted here.

Furthermore, in the present embodiment, the materials and the structures of the quantum dots 1213, 1223, 1243 are similar to those described in Embodiment 1, so the description related thereto is omitted here.

Embodiment 3

The present embodiment provides a liquid crystal display device using the patterned color conversion film provided by Embodiment 1.

Figure 4:
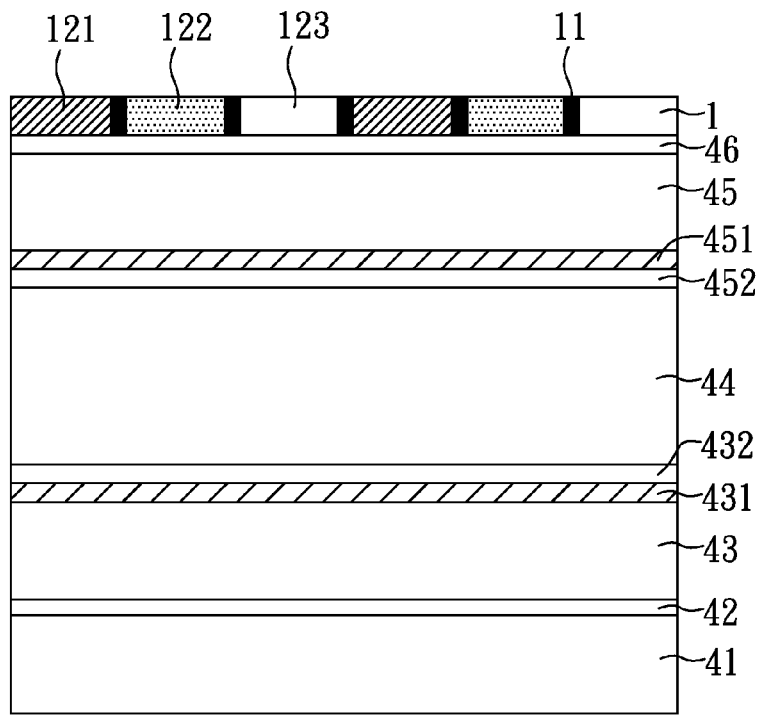
FIG. 4 is a cross-sectional view of a liquid crystal display device according to Embodiment 3 of the present invention.

As shown in FIG. 4, the liquid crystal display device of the present embodiment comprises: a light source 41; and a patterned color conversion film 1 disposed on an emitting surface of the light source 41. Except for the aforementioned units, the liquid crystal display device of the present embodiment further comprises: a first polarizer 42 disposed on the light source 41; a first substrate 43 disposed on the first polarizer 42, wherein a first electrode 431 and a first alignment layer 432 are sequentially disposed on the first substrate 43; a second substrate 45 with a second electrode 451 and a second alignment layer 452 sequentially disposed on a first side thereof, wherein the first alignment layer 432 corresponds to the second alignment layer 452; a liquid crystal layer 44 disposed between the first substrate 43 and the second substrate 45; and a second polarizer 46 disposed on a second side of the second substrate 45. Additionally, the patterned color conversion film 1 is disposed on a first side of the second polarizer 46 opposite to a second side thereof facing to the first polarizer 42. In other embodiment, the first alignment layer 432 and the second alignment layer 452 can be selectively used or not used in the liquid crystal display device.

More specifically, in the present embodiment, the second polarizer 46 is disposed on the second side of the second substrate 45 without the second electrode 451 formed thereon. The patterned color conversion film 1 is disposed on the second polarizer 46, so that the second polarizer 46 is disposed between the patterned color conversion film 1 and the second substrate 45.

In the present embodiment, the light source 41 is a blue-light backlight module, so the patterned color conversion film 1 provided in Embodiment 1 is used herein. The patterned color conversion film 1 used herein comprises: a separator 11;

and red pixel units 121, green pixel units 122, and transparent pixel units 123 disposed in the separator 11 respectively.

Although the patterned color conversion film of Embodiment 1 is used with a blue-light backlight module in the present embodiment, a person skilled in the art may understand that the patterned color conversion film of Embodiment 2 can be used with an UV-light backlight module in other embodiments.

In addition, the first substrate 43 and the second substrate 45 used in the display device of the present embodiment can be any flexible substrate or transparent substrate, such as a glass substrate and a plastic substrate.

Preferably, the glass substrates are used as the first substrate 43 and the second substrate 45 in the present embodiment. The material of the first electrode 431 and the second electrode 451 can be any transparent material generally used in the art, such as ITO and IZO. Meanwhile, the material of the first alignment layer 432 and the second alignment layer 452 can be any material generally used in the art, which is capable of facilitating the orientation of liquid crystals, such as polyimide (PI).

Embodiment 4

Figure 5:
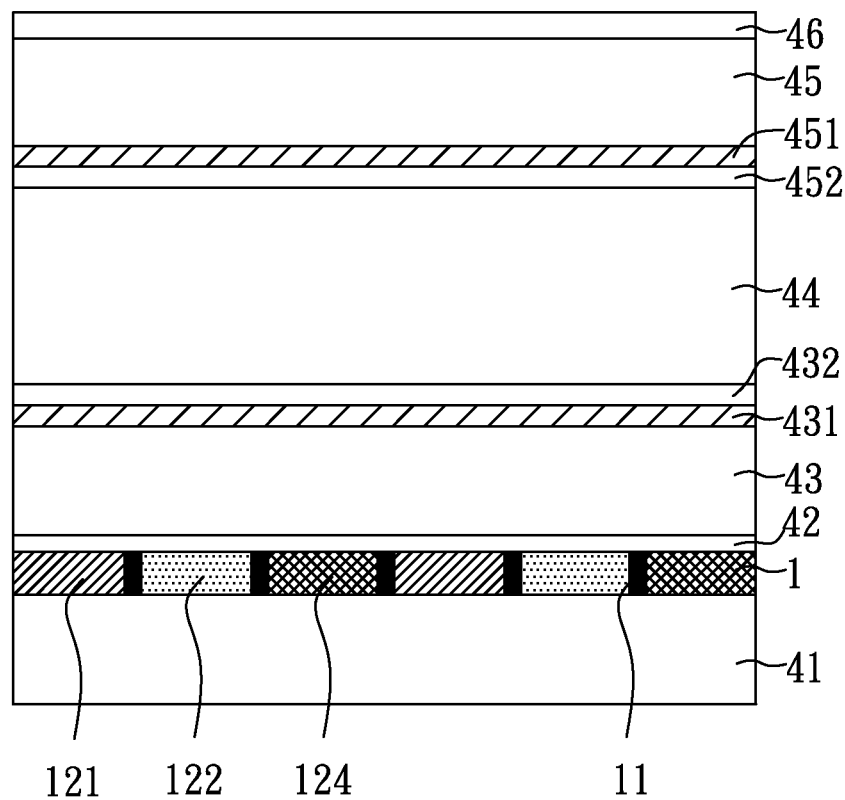
FIG. 5 is a cross-sectional view of a liquid crystal display device according to Embodiment 4 of the present invention.

The present embodiment provides a liquid crystal display device using the patterned color conversion film provided by Embodiment 2. As shown in FIG. 5, the structure of the liquid crystal display device of the present embodiment is similar to that of Embodiment 3, except for the following differences.

The light source 41 of the present embodiment is an UV-light backlight module, and the patterned color conversion film 1 used herein is that provided in Embodiment 2. Hence, the patterned color conversion film 1 used herein comprises: a separator 11; and red pixel units 121, green pixel units 122, and blue pixel units 124 disposed in the separator 11 respectively. However, a person skilled in the art may understand that the patterned color conversion film of Embodiment 1 can be used with a blue-light backlight module in other embodiments.

In addition, the position of the patterned color conversion film of the present embodiment is different from that of Embodiment 3. In the present embodiment, the patterned color conversion film 1 is disposed on a first side of the first polarizer 42 opposite to a second side thereof facing to the second polarizer 46, i.e. the first side thereof near to the light source 41. More specifically, the patterned color conversion film 1 of the present embodiment is disposed between the light source 41 and the first polarizer 42.

The other units used in the present embodiment are similar to those illustrated in Embodiment 3, so the description related thereto is omitted here.

Embodiment 5

Figure 6:
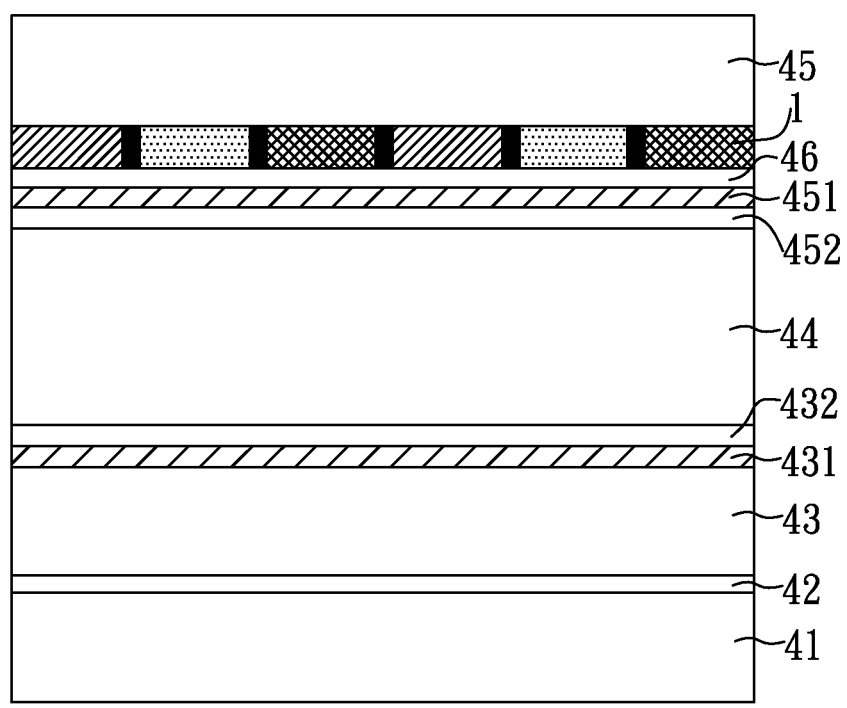
FIG. 6 is a cross-sectional view of a liquid crystal display device according to Embodiment 5 of the present invention.

The present embodiment provides a liquid crystal display device using the patterned color conversion film provided by Embodiment 2. As shown in FIG. 6, the structure of the liquid crystal display device of the present embodiment is similar to that of Embodiment 4, except for the following differences.

The positions of the patterned color conversion film 1 and the second polarizer 46 of the present embodiment are different from those of Embodiment 4. In the present embodiment, the second polarizer 46 is disposed between the second substrate 45 and the second electrode 451, and the patterned color conversion film 1 is disposed on a first side of the second polarizer 46 opposite to a second side thereof facing to the first polarizer 42. More specifically, the second polarizer 46 is disposed between the second substrate 45 and the second electrode 451, and the patterned color conversion film 1 is disposed between the second substrate 45 and the second polarizer 46. Hence, from a surface (i.e. the first side) of the second substrate 45, the patterned color conversion film 1, the second polarizer 46, the second electrode 451 and the second polarizer 452 are sequentially laminated thereon.

The other units used in the present embodiment are similar to those illustrated in Embodiment 4, so the description related thereto is omitted here.

Embodiment 6

The present embodiment provides an OLED display device using the patterned color conversion film provided by Embodiment 1.

Figure 7A:
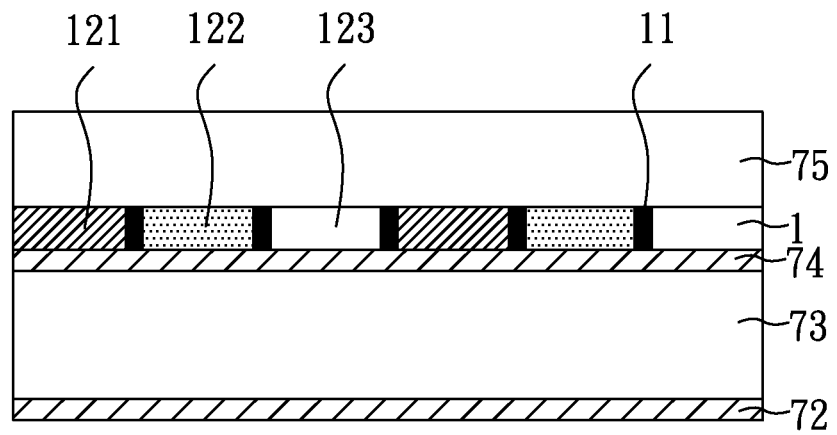
FIGS. 7A-7B are cross-sectional views of OLED display devices according to Embodiment 6 of the present invention.

As shown in FIG. 7A, the OLED display device of the present embodiment comprises: a light source 73; and a patterned color conversion film 1 disposed on an emitting surface of the light source 73. Except for the aforementioned units, the OLED display device of the present embodiment further comprises: a first electrode 72 disposed under the light source 73; a second electrode 74 disposed on the light source 73; and a second substrate 75 disposed on the second electrode 74, wherein the light source 73 is an organic layer and disposed between the first electrode 72 and the second electrode 74, and the patterned color conversion film 1 is disposed on the second electrode 74. As shown in FIG. 7A, the organic layer (i.e. the light source 73) is formed on a metal electrode layer (i.e. the first electrode 72). The patterned color conversion film 1 is disposed between the second electrode 74 and the second substrate 75, and comprises: a separator 11; and red pixel units 121, green pixel units 122 and transparent pixel units 123 disposed in the separator 11 respectively.

Figure 7B:
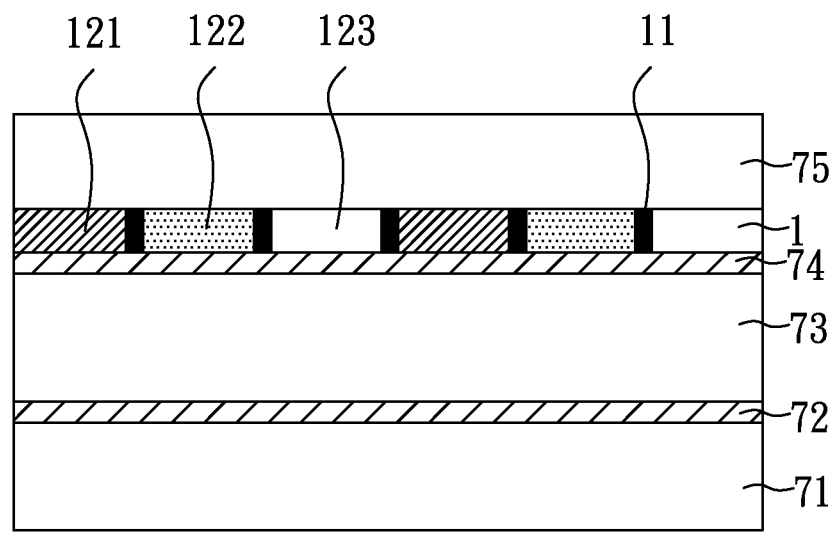

In another aspect, as shown in FIG. 7B, a first substrate 71 may be selectively disposed under the first electrode 72; the organic layer (i.e. the light source 73) is disposed between the first substrate 71 and the second substrate 75; and the patterned color conversion film 1 is disposed between the second substrate 75 and the second electrode 74.

In addition, in the present embodiment, the first substrate 71 and the second substrate 75 used in the display device of the present embodiment can be any flexible substrate or transparent substrate, such as a glass substrate and a plastic substrate. The material of the first electrode 72 and the second electrode 74 can be any transparent material generally used in the art, as long as the electrode located on the emitting surface of the light source 73 has high light-transmitting rate. For example, the first electrode 72 and the second electrode 74 can respectively be a transparent conductive oxide electrode, such as ITO and IZO electrodes; a metal electrode such as electrodes made of Au, Ag, Pt, or alloy thereof, and a composite electrode containing the same; or single layer or multi-layer electrodes using the same. In addition, the organic layer used as the light source 73 in the present embodiment can have multi-layer structure commonly used in the art. For example, the organic layer comprises: an electron injection/transporting layer, at least one light-emitting layer, and a hole injection/transporting layer. In the present embodiment, only basic structure of the organic layer is exemplified, but a person skilled in the art can understand that the organic layer may further comprise other functional layers to improve the light emitting efficiency thereof.

In the present embodiment, only top-emitting OLED display devices are exemplified, but a person skilled in the art may understand that the patterned color conversion film provided by Embodiment 1 may be also used in bottom-emitting OLED display devices. In addition, the disposition and the amount of the patterned color conversion film may be different in the devices having a single light extraction side and double light extraction sides, and only the OLED display devices with the single light extraction side are exemplified in the present embodiment. In other embodiments, for example, two patterned color conversion films are respectively disposed on two light extraction sides of the other display devices.

Hereafter, the viewing angles, the backlight absorption rate and the light extraction rate of the patterned color conversion film (PCCF) are examined.

In the following experimental examples, red-emitting quantum dots having CdSe/CdS/ZnS core-shell structures are used. As shown in FIG. 2, the core 21 is made of CdSe, CdS and ZnS are sequentially formed on the core 21 to form a shell 22, and then the shell 22 is modified with a surfactant 23 of trioctylphosphine oxide (TOPO). In addition, the medium used in PCCF is PMMA, and the scattering particles used therein are ZnO particles having refractive index about 2.0 and diameters about 0.1-0.5 μm.

Experimental Example 1

In Experimental Group 1 (hereinafter as Ex. 1) of the present example, a glass was spin-coated with a PMMA medium dispersed with 2.5 wt % (11% by volume) of red-emitting quantum dots and 1 wt % (4.5% by volume) of ZnO scattering particles to form a PCCF with a thickness of 50 μm. In Comparative Group 1 (hereinafter as Comp. 1) of the present example, the PCCF was almost the same as that of Ex. 1, except that the ZnO scattering particles were not added therein. In the present example, red pixel units were used to be tested.

After the red pixel units were irradiated with 365 nm UV-light, it can be found that the light emitting from the side of the glass was greatly reduced in the PCCF containing ZnO scattering particles (Ex. 1) (not shown in the figure), and this result indicates that less light entered into the waveguide mode in the PCCF of Ex. 1. However, light emitting from the side of the glass was significantly observed in the PCCF without ZnO scattering particles (Comp. 1) (not shown in the figure). These results indicate that most light can be extracted from the front side of the PCCF when suitable ZnO particles are added therein as the scattering particles.

In addition, the PCCFs of Ex. 1 and Comp. 1 of the present example were irradiated with a blue-light backlight unit, and the spectra generated therefrom at different viewing angles were analyzed with Spectral Irradiance Meter. The results are shown in FIGS. 8A and 8B, wherein FIG. 8A shows a relation between viewing angels and normalized intensity of backlight passing through PCCF but unabsorbed by quantum dots, and FIG. 8B shows a relation between viewing angles and normalized intensity of red light obtained from backlight irradiating into PCCF, and absorbed and converted by quantum dots.

Figure 8A:
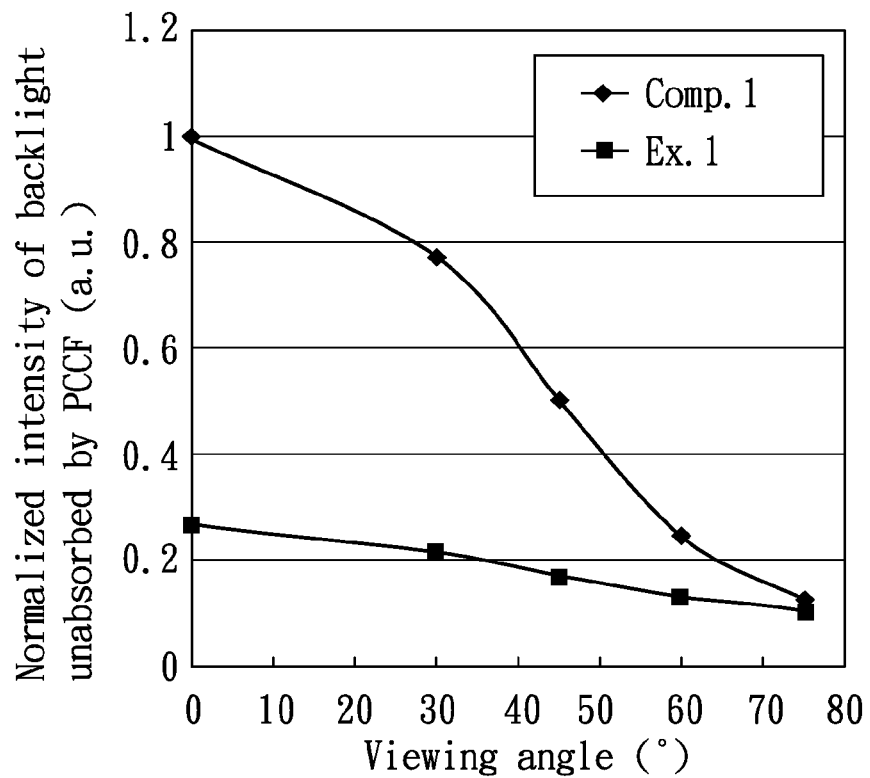
FIG. 8A shows a relation between viewing angels and normalized intensity of backlight passing through PCCF but unabsorbed by quantum dots therein according to Experimental Example 1 of the present invention.

As shown in FIG. 8A, in comparison to the PCCF of Comp. 1, the observed backlight that passed through the PCCF of Ex. 1 and was not absorbed by quantum dots dispersed therein was greatly reduced. After calculation, when the PCCF of Ex. 1 was irradiated with the blue-light backlight unit, the observed backlight passing through the PCCF and not absorbed by quantum dots was greatly decreased about 275% at the front viewing angle (i.e. the viewing angle =0°), and this result indicates that the PCCF with the ZnO scattering particles (Ex. 1) can increase the absorption of backlight. In other words, even though the thickness of the PCCF was not increased, both high backlight absorption rate and low unexpected backlight transmitting rate can also be achieved.

Figure 8B:
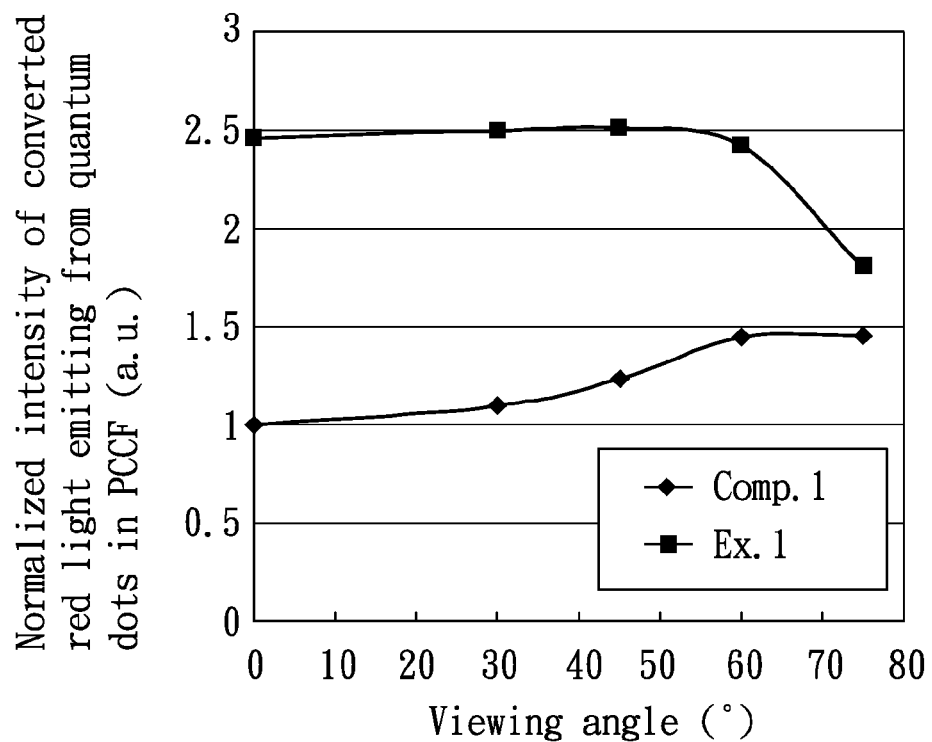
FIG. 8B shows a relation between viewing angles and normalized intensity of red light obtained from backlight irradiating into PCCF and absorbed and converted by quantum dots according to Experimental Example 1 of the present invention.

As shown in FIG. 8B, in comparison to the PCCF of Comp. 1, the intensity of the observed red light obtained from the blue backlight that irradiated into PCCF, and was absorbed and converted by the quantum dots was greatly increased. Especially, compared to the PCCF of Comp. 1, the intensity of the observed red light emitting from the PCCF of Ex. 1 was increased 150% at the front viewing angles (i.e. the viewing angle=0°). This result indicates that the problem that the intensity is higher at large viewing angle (about) 60° (Comp. 1) can be solved by using the ZnO scattering particles (Ex. 1).

Furthermore, the PCCFs of Ex. 1 and Comp. 1 of the present example were irradiated with a blue-light LED device as a backlight source, and the full spectra (including red light and blue light) of the backlight and the obtained light that the backlight passing through the PCCFs were analyzed with a conoscopy.

The results show that high percentage of the blue backlight passed through the PCCF of Comp. 1, so the light pattern after passing through the same did not change, which caused that the viewing angles of the PCCF of Comp. 1 were similar to those of the backlight, and the light pattern thereof was present in a flat ellipse (not shown in the figure). It can be concluded that non-uniform viewing angle characteristics are present in the PCCF of Comp. 1. On the contrary, most of the blue backlight can be absorbed by the quantum dots in the PCCF of Ex. 1 and few backlight directly passed through the same, so the light pattern thereof can be led by the red light converted by the quantum dots and was present in a concentric circle (not shown in the figure). It also can be concluded that uniform viewing angle characteristics are present in the PCCF of Ex. 1.

When the light passing through the PCCFs was separated into blue light and red light with a color filter and the relationship between the obtained blue light and the obtained red light was analyzed, it can be found that the blue light pattern of the light passing through the PCCF of Ex. 1 was changed from a flat ellipse into a concentric circle with a maximum intensity of the observed blue light at the front viewing angle (i.e. the viewing angle=0°). In addition, the viewing angle that maximum intensity of the obtained red light observed was changed from the viewing angle of 60° into the front viewing angle (i.e. the viewing angle=0°), and the red light pattern thereof also present in a concentric circle as the blue light pattern thereof (not shown in the figure).

According to the aforementioned results, it can be concluded that the problem of non-uniform viewing angles can be effectively solved by using scattering particles.

Experimental Example 2

In Experimental Groups 2-5 (hereinafter as Exs. 2-5) of the present example, a glass was respectively spin-coated with a PMMA medium dispersed with 0.2, 1.0, 2.0, and 5.0 wt % (about 1, 4.5, 8.8, and 20% by volume) of ZnO scattering particles to form PCCFs with a thickness of 30 μm. In Comparative Group 2 (hereinafter as Comp. 2) of the present example, the PCCF was almost the same as that of Exs. 2-5, except that the ZnO scattering particles were not added therein. In the present example, transparent pixel units without adding quantum dots (i.e. the volume concentration of the quantum dots in the pixel unit is about 0% by volume) were used to be tested.

The PCCFs of Exs. 2-5 and Comp. 2 of the present example were irradiated with a blue light backlight source, and the normalized intensity of the 450 nm blue light passing through the same at different viewing angles were analyzed with Spectral Irradiance Meter.

Figure 9:
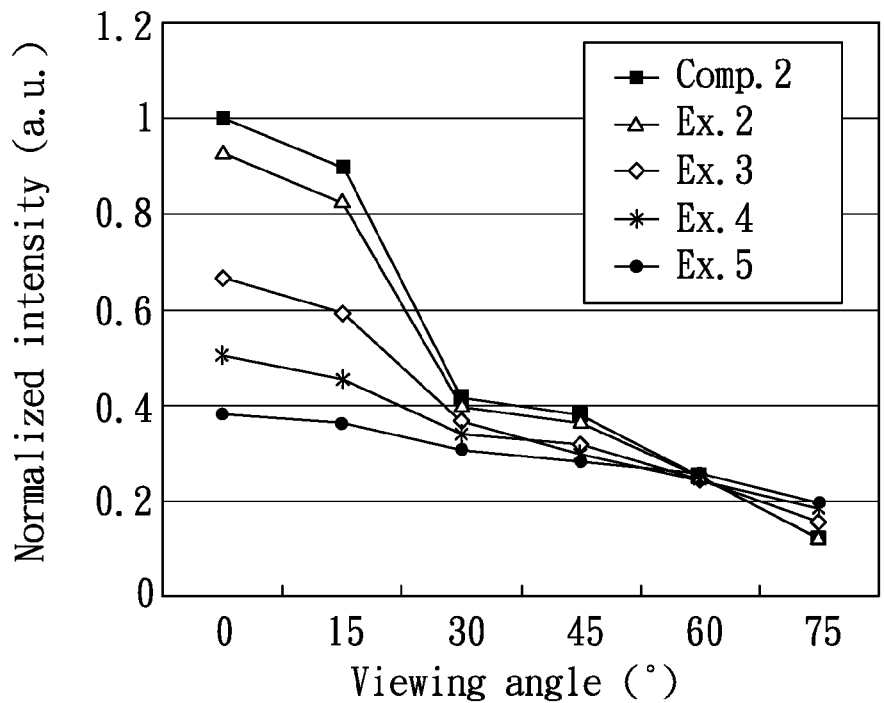
FIG. 9 shows a relation between viewing angles and normalized intensity of observed blue light according to Experimental Example 2 of the present invention.

As shown in FIG. 9, uniform intensity of the observed light at different viewing angles can be obtained by adding suitable amount of the scattering particles (Exs. 2-5). Especially, the intensity of the observed blue light passing through PCCFs at the front viewing angle was similar to that at the large viewing angle, as the concentration of the scattering particles increased.

Experimental Example 3

In Experimental Groups 6-9 (hereinafter as Exs. 6-9) of the present example, a glass was spin-coated with a PMMA medium dispersed with 2.5 wt % (11% by volume) of red-emitting quantum dots and 0.2, 1.0, 2.0, and 5.0 wt % (about 1, 4.5, 8.8, and 20% by volume) of ZnO scattering particles respectively to form a PCCF with a thickness of 30 μm. In Comparative Group 3 (hereinafter as Comp. 3) of the present example, the PCCF was almost the same as that of Exs. 6-9, except that the ZnO scattering particles were not added therein. In the present example, red pixel units were used to be tested.

The PCCFs of Exs. 6-9 and Comp. 6 of the present example were irradiated with a blue light backlight source, and the normalized intensity of the 630 nm red light emitting from the same at different viewing angles were analyzed with TR1 spectrum analyzer.

Figure 10:
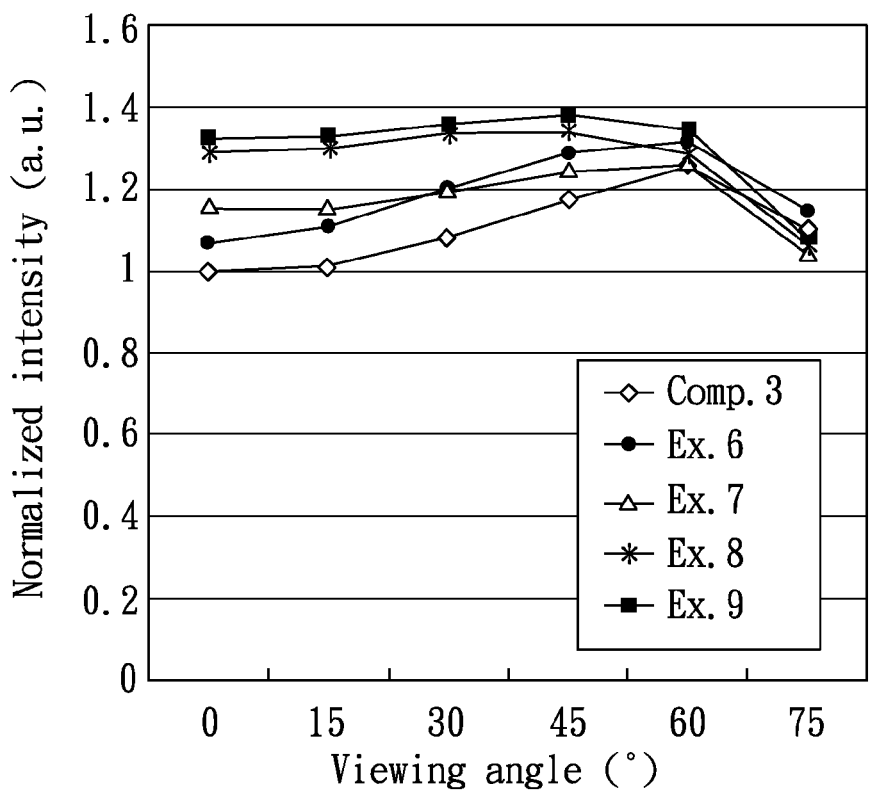
FIG. 10 shows a relation between viewing angles and normalized intensity of observed red light according to Experimental Example 3 of the present invention.

As shown in FIG. 10, when suitable amounts of the scattering particles were added into the PCCFs (Exs. 6-9), the intensity of the observed red light was increased, and the intensity thereof at different viewing angles were similar to each other. These results indicate that suitable amounts of the scattering particles can increase light extraction rate and improve the viewing angle characteristics of PCCFs. In should be noted that the maximum improved effect of the scattering particles was almost obtained when the concentration of the ZnO scattering particles was 2 wt % (8.8% by volume, and the distance between the ZnO scattering particles was about 0.5 μm) (Ex. 8). Even though the concentration thereof was increased to 5 wt % (20% by volume, and the distance between the ZnO scattering particles was about 0.4 μm) (Ex. 9), the improved effect thereof was almost the same as that observed in Ex. 8. These results indicate that the improved effect of the scattering particles still has its limitation as the distance therebetween is close to the wavelength of blue light and red light. Especially, when the concentration of the scattering particles is increased and more than 20% by volume, the aggregation of the scattering particles may lead the scattering effect thereof decreased, which causes the light transmitting rate and the light extraction rate of the PCCFs decreased and material waste.

According to the aforementioned results shown in Experimental Examples 1-3, the backlight utilization rate (i.e. the backlight absorption rate) and the light extraction rate of the PCCFs can be increased as well as the disadvantage of poor viewing angles thereof can be improved by adding suitable amount of scattering particles therein.

Although the present invention has been explained in relation to its preferred embodiment, it is to be understood that many other possible modifications and variations can be made without departing from the spirit and scope of the invention as hereinafter claimed.

What is claimed is:

1. A patterned color conversion film, comprising:
    a separator with plural openings; and
    plural pixel units disposed in the openings respectively, each pixel unit respectively comprising a medium and scattering particles dispersed therein,
    wherein at least one of the plural pixel units comprises quantum dots having the scattering particles sized of between 0.05 and 1 μm when a volume concentration of the quantum dots is in a range more than or equal to 5% and less than or equal to 80%, or having the scattering particles sized of between 0.2 and 2 μm when the volume concentration of the quantum dots is in a range less than 5% and more than or equal to 0%.

2. The patterned color conversion film as claimed in claim 1, wherein a volume concentration of the scattering particles is 0.5-20% respectively.

3. The patterned color conversion film as claimed in claim 1, wherein a refractive index of the medium is in a range from 1.4 to 1.7 respectively.

4. The patterned color conversion film as claimed in claim 1, wherein a refractive index of the scattering particles is in a range from 1.0 to 3.0, and the refractive index of the scattering particles is different from that of the medium.

5. The patterned color conversion film as claimed in claim 4, wherein each scattering particle is made of an inorganic material, a transparent polymer, glass, hole, or a combination thereof respectively.

6. The patterned color conversion film as claimed in claim 5, wherein each scattering particle is made of ZnO, $TiO_2$, polystyrene, polycarbonate, styrene-acrylonitrile, $SiO_2$, borosilicate, air, or a combination thereof respectively.

7. The patterned color conversion film as claimed in claim 1, wherein a thickness of the patterned color conversion film is 10-300 μm.

8. The patterned color conversion film as claimed in claim 1, wherein the separator is made of a resin, a black matrix, a white matrix, a metal, a dried film, or a combination thereof.

9. The patterned color conversion film as claimed in claim 1, wherein at least one of the plural pixel units comprise a red pixel unit, a green pixel unit, and a blue pixel unit, and each pixel unit respectively comprises: the medium, the scattering particles dispersed therein, and the quantum dots dispersed therein.

10. The patterned color conversion film as claimed in claim 1, wherein at least one of the plural pixel units comprises a red pixel unit, a green pixel unit, and a transparent pixel unit, the red pixel unit and the green pixel unit respectively comprises: the medium, the scattering particles dispersed therein, and the quantum dots dispersed therein, and the transparent pixel unit comprises: the medium, and the scattering particles dispersed therein.

11. A display device, comprising:
    a light source; and
    a patterned color conversion film disposed on an emitting surface of the light source and comprising:
        a separator with plural openings; and
        plural pixel units disposed in the openings respectively, each pixel unit respectively comprising: a medium and scattering particles dispersed therein,
        wherein at least one of the plural pixel units comprises quantum dots having the scattering particles sized of between 0.05 and 1 μm when a volume concentration of the quantum dots is in a range more than or equal to 5% and less than or equal to 80%, or having the scattering particles sized of between 0.2 and 2 μm when the volume concentration of the quantum dots is in a range less than 5% and more than or equal to 0%.

12. The display device as claimed in claim 11, further comprising:

a first polarizer disposed on the light source;

a first substrate disposed on the first polarizer, wherein a first electrode is disposed on the first substrate;

a second substrate with a second electrode disposed on a first side thereof;

a liquid crystal layer disposed between the first substrate and the second substrate; and a second polarizer disposed on a second side of the second substrate, or between the second substrate and the second electrode;

wherein the patterned color conversion film is disposed on a first side of the first polarizer opposite to a second side thereof facing to the second polarizer, or a first side of the second polarizer opposite to a second side thereof facing to the first polarizer.

13. The display device as claimed in claim 12, wherein the second polarizer is disposed on the second side of the second substrate, and the patterned color conversion film is disposed on the second polarizer or between the light source and the first polarizer.

14. The display device as claimed in claim 12, wherein the second polarizer is disposed between the second substrate and the second electrode, and the patterned color conversion film is disposed between the second substrate and the second polarizer.

15. The display device as claimed in claim 11, further comprising:

a first electrode disposed under the light source; and a second electrode disposed on the light source, wherein the light source is an organic layer and disposed between the first electrode and the second electrode, and the patterned color conversion film is disposed on the second electrode.

16. The display device as claimed in claim 11, wherein the light source is a blue-light source, at least one of the plural pixel units comprises a red pixel unit, a green pixel unit, and a transparent pixel unit, the red pixel unit and the green pixel unit respectively comprises: the medium, the scattering particles dispersed therein, and the quantum dots dispersed therein, and the transparent pixel unit comprises: the medium, and the scattering particles dispersed therein.

17. The display device as claimed in claim 11, wherein the light source is an UV-light source, at least one of the plural pixel units comprises a red pixel unit, a green pixel unit, and a blue pixel unit, and the red pixel unit, the green pixel unit, and the blue pixel unit respectively comprises: the medium, the scattering particles dispersed therein, and the quantum dots dispersed therein.

18. The display device as claimed in claim 11, wherein a volume concentration of the scattering particles is 0.5-20% respectively.

19. The display device as claimed in claim 11, wherein a refractive index of the scattering particles is in a range from 1.0 to 3.0 respectively, and the refractive index of the scattering particles is different from that of the medium.

20. The display device as claimed in claim 11, wherein each scattering particle is made of an inorganic particle, a transparent polymer, glass, hole, or a combination thereof respectively.

* * * * *